United States Patent [19]

Hayes

[11] Patent Number: 5,411,602
[45] Date of Patent: May 2, 1995

[54] SOLDER COMPOSITIONS AND METHODS OF MAKING SAME

[75] Inventor: Donald J. Hayes, Plano, Tex.

[73] Assignee: MicroFab Technologies, Inc., Plano, Tex.

[21] Appl. No.: 197,750

[22] Filed: Feb. 17, 1994

[51] Int. Cl.⁶ .............................................. B23K 35/34
[52] U.S. Cl. .......................................... 148/23; 148/24
[58] Field of Search ........................ 148/23, 24; 75/331

[56] References Cited

U.S. PATENT DOCUMENTS

| | | | |
|---|---|---|---|
| 3,986,899 | 10/1976 | Kole | 148/23 |
| 5,147,448 | 9/1992 | Roberts | 75/331 |
| 5,171,360 | 12/1992 | Orme | 75/331 |
| 5,259,593 | 11/1993 | Orme | 75/331 |

Primary Examiner—Peter D. Rosenberg
Attorney, Agent, or Firm—Jack A. Kanz

[57] ABSTRACT

Spherical solder drops having precise and accurate shape are formed by an ejection device and solidified to form solder balls for making solder pastes. The diameters of the solidified solder balls are determined by an excitation signal applied to the ejection device and changes in the diameter of the orifice in the ejection device. A solder paste is produced by mixing solidified solder balls of a single diameter or a combination of several different diameters with a carrier.

43 Claims, 6 Drawing Sheets

SOLDER COMPOSITIONS AND METHODS OF MAKING SAME

This invention relates to metallic solder compositions. More particularly, it relates to methods of making spherical metal particles of precise size and shape and to making improved solder pastes from such spherical metal particles.

Solder pastes, generally composed of powdered solder alloys dispersed in a relatively small volume of carrier, currently find wide acceptance in the electronics industry. In particular, solder pastes are commonly used to surface mount electronic components on printed circuit boards and other electronic substrates.

To solder bond surface mount components to a printed circuit board, a volume of solder paste is deposited (via screen printing or the like) on metallized areas arranged in a pattern on the board corresponding to that of the leads or contact pads on the surface mount components. Following deposit of the solder paste, each component is placed on the circuit board so that its leads or contact pads are in contact with the corresponding solder-coated metallized areas on the printed circuit board. Thereafter, the solder paste is reflowed, typically by heating, to bond the components to the printed circuit board. In these applications the solder paste generally performs three basic functions. It provides the solder (metallic particles) which forms the final joint or bond. It supplies the flux necessary to clean and promote wetting of the surfaces to be bonded. Furthermore, it holds the components in place until the solder is reflowed.

Although solder pastes may be composed of different components, they generally comprise 1) solder powder which is a distribution of metallic particles; 2) flux to promote wetting of the metal to be soldered by removing oxides and contaminates from the surfaces to be joined; 3) viscosity control agents such as rheological polymers to control the rheological properties which influence the deposition characteristics of the solder paste; and 4) solvents to aid in the flux activation process and to improve shelf life of the flux.

Prior art solder paste compositions have not been entirely satisfactory for a number of reasons. The primary problems include variation in particle size of the metal particles and very broad distribution of particle size. For example, a typical prior art solder paste with a nominal particle size of 60 $\mu$m may have a distribution with a small population of very fine solder particles and a quantity of larger solder particles as large as 80 $\mu$m as shown in FIG. 1. Very small solder particles have a large surface-to-volume ratio and, therefore, contain a large percentage of surface oxides. Solder particles with diameters less than 10 $\mu$m are ordinarily undesireable in solder pastes because of the oxides present on their surfaces.

Solder particles in the solder paste must be consistent with the intended application technique. As a general rule, the maximum diameter of the solder particle should be no more than $\frac{1}{4}$ to $\frac{1}{3}$ as large as the opening through which the solder paste will be printed or dispensed because larger particles tend to clog the screens or dispensing needles. Obviously, optimizing solder pastes for the application method is very difficult without tight control of the diameters of the solder particles. Solder pastes containing solder particles in which the diameters of the solder particles are precisely controlled and relatively free of oxides, even when their diameters are smaller than normal, are therefore highly desireable.

In accordance with the present invention, solidified solder balls of spherical shape with predictably precise and accurate diameters are provided for making improved solder pastes. Such solder balls are produced by ejecting generally spherical drops of liquid solder from an ejection device and catching the resulting solidified solder balls while maintaining an atmosphere of inert gas between the ejection device and the receptacle. Solidified solder balls can be formed with diameters which vary in a predetermined manner by exciting the ejection device with a signal whose frequency varies in a predetermined manner across a range of frequencies (e.g. between a first frequency and a second higher frequency). Improved solder pastes are then produced by mixing the solidified solder balls of a single diameter or a combination of several different diameters with a suitable carrier. The present invention includes the ability to 1) make metal particles or solder balls of precise and accurate diameter for use in solder pastes; 2) make metal particles or solder balls of precise and accurate but different predetermined diameters among the solder particles; and 3) make metal particles or solder balls which have little surface oxidation. Other advantages and features of the invention will become more readily understood from the following detailed description taken in connection with the appended claims and attached drawing, wherein like reference numerals have been applied to like elements.

Figure 8:
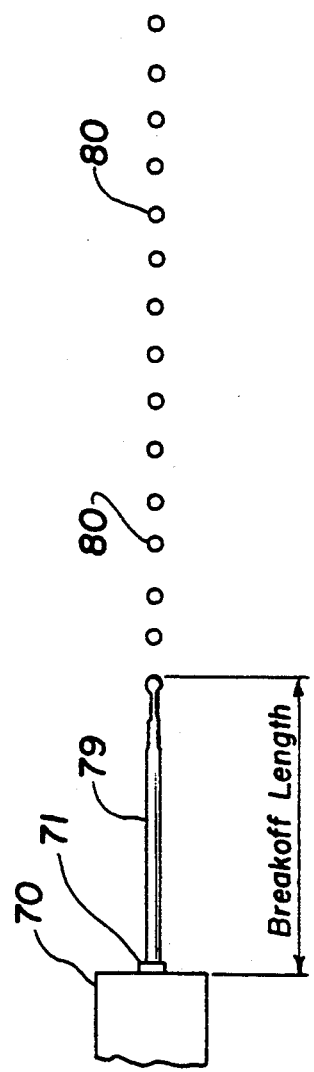
FIG. 8 is a pictorial illustration of the preferred method of forming of solder balls in accordance with the invention.
Figure 7:
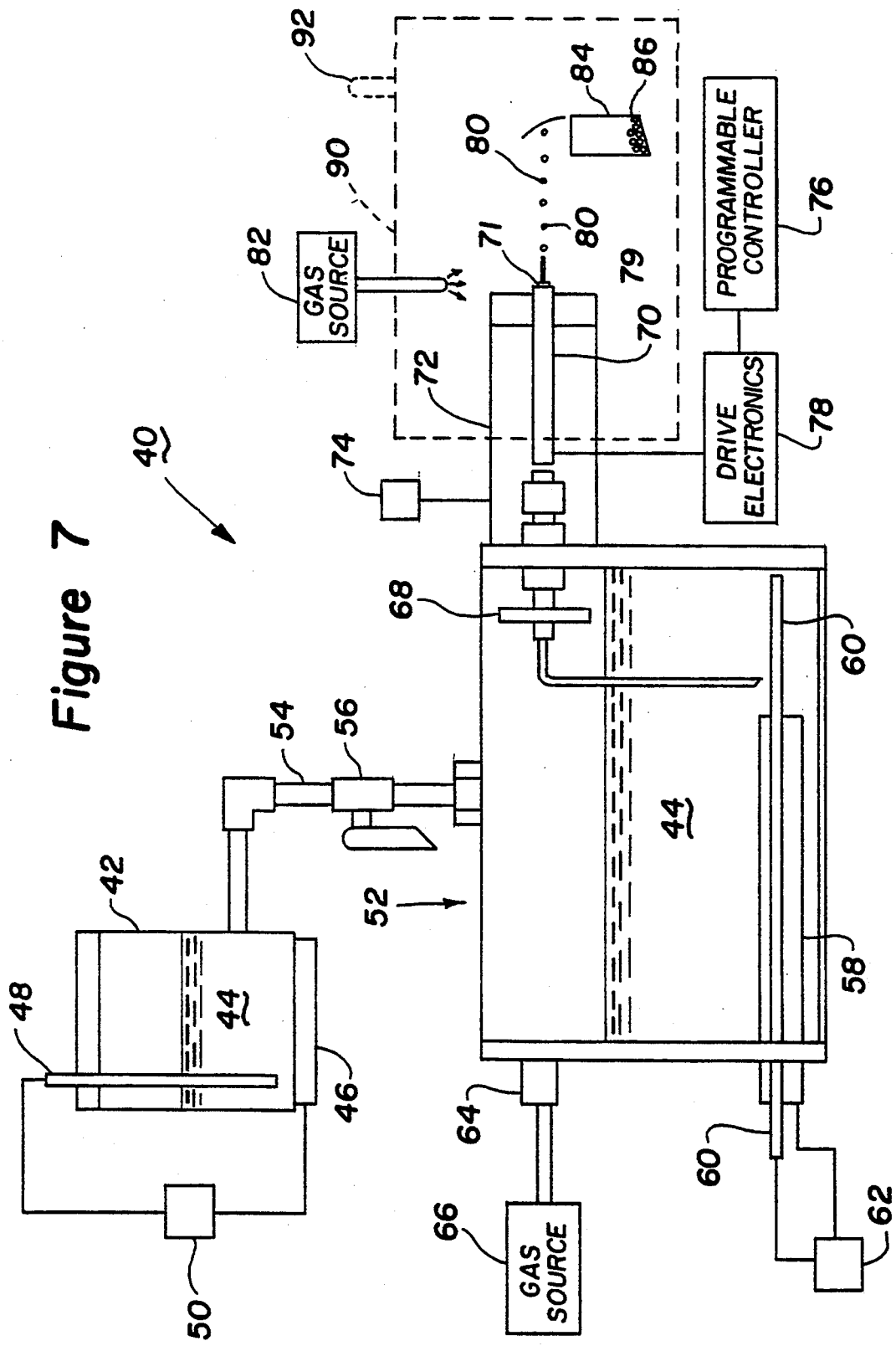
FIG. 7 is a pictorial illustration of the presently preferred apparatus for forming solder particles with precisely controlled diameters in accordance with the invention.

The presently preferred apparatus for forming spherical solder particles in accordance with the invention is illustrated in FIGS. 7 and 8. The apparatus operates by producing and ejecting spherically-shaped bodies of liquid solder (solder alloy) which are caught in a receptacle or catcher and includes a preload reservoir 42 for initially receiving and holding liquid solder or solder alloy 44. Heating element 46 is operatively positioned in preload reservoir 42 to heat the solder or solder alloy 44 in the reservoir 42. Thermocouple 48 (or other temperature monitoring device) is mounted to sense the temperature of liquid solder 44 and is connected to power source 50. The output of the thermocouple is used to control the output of power source 50 which, in turn, controls heating element 46 to maintain the solder 44 at the required temperature and in a liquid state.

An ejection chamber 52 is connected to the outlet of preload reservoir 42 through conduit 54 and valve 56 to allow liquid solder 44 to flow from the preload reservoir 42 into ejection chamber 52. Oxides and impurities tend to stay at the top of the liquid solder or solder alloy 44 in the preload reservoir 42 and thus do not enter the ejection chamber 52. If high purity solder alloys are used, the preload chamber may not be necessary.

To purge the system in preparation for operation, the ejection chamber 52 is pressurized through inlet port 64 with an inert gas from gas source 66 which forces liquid solder 44 through filter 68 into the ejection device 70. The ejection chamber 52 is pressurized during operation with an inert gas to eliminate any oxygen in the atmosphere above the liquid solder 44.

A heater 72 surrounds ejection device 70 and controls the temperature of the liquid solder 44 within the ejection device 70. Heater 72 is connected to power source 74. Programmable controller 76 provides activating signals to drive electronics 78 whose output causes ejection device 70, which is preferably a continuous ejection type device, to form drops 80 of liquid solder 44 from the liquid solder stream 79 ejected from orifice 71 under pressure from gas source 66.

As illustrated in FIG. 8 the liquid solder stream 79 ejected from orifice 71 of the continuous ejection device 70 form drops 80 of liquid solder as a result of activating signals from drive electronics 78. The space between ejection device 70 and container or catcher 84 is surrounded by a chamber 90 which is filled with a relatively inert gas, such as nitrogen or helium, to eliminate oxygen from the path traveled by solder drops 80. As illustrated in FIG. 7, a gas source 82 provides a flow of inert gas through the space traveled by drops 80 and occupied by the container or catcher 84.

It will be appreciated that chamber or housing 90 enclosing the path traveled by the drops 80 of liquid solder 44 and the catcher 84 further insures that drops 80 will not be subject to oxidation. The housing 90 may be used to provide a positive gas flow from gas source 82 to outlet 92. Thus oxides and/or contaminants removed from the space will flow out outlet 92 along with the inert gas and will not be deposited on the drops 80. The inert atmosphere also greatly enhances formation of generally spherical drops 80 of liquid solder 44 which solidify into generally spherical solder balls 86 and are caught in container or catcher 84. Obviously, the chamber 90 must be long enough to allow the drops 80 of liquid solder to solidify before hitting catcher 84.

In the preferred embodiment, ejection device 70 comprises an electro-mechanical transducer (which can be piezoelectric, electromagnetic, etc.) which causes the liquid solder stream 79 to break up into drops 80 of liquid solder 44 in response to an excitation signal from drive electronics 78. Upon cooling, the drops 80 of liquid solder 44 become solidified spherical solder balls 86 which are caught in container or catcher 84.

In accordance with the invention, ejection device 70 is precisely controlled to produce solder balls 86 which are spherical in shape and very predictably precise in diameter. The diameters of the resulting solder balls, however, can be varied as desired. In the preferred embodiment, ejection device 70 has an orifice or nozzle opening 71 of about ten (10) to about sixty (60) μm in diameter and is excited with a signal from drive electronics 78 having a frequency between about five thousand (5000) to one million (1,000,000) hertz. Changes in the amount or volume (and diameter of the resulting solder balls 86) of the drop or drops 80 are controlled by the excitation frequency provided to ejection device 70 by drive electronics 78. Small changes in diameter (and volume) of the solder balls 86 require only changes in excitation frequency applied to ejection device 70 by drive electronics 78 and controlled by programmable controller 76. Large changes require changes in size of the orifice 71 in ejection device 70. In the apparatus described, solder balls 86 can be provided which range in diameter from as small as 10 μm to as large as 80 μm.

The process of forming solder balls 86 in accordance with the invention begins with placing solid solder in preload reservoir 42. Power is applied to heating element 46 to bring the temperature of the solder to its particular melting point. After the solder is melted in the preload reservoir 42, a portion thereof is transferred through conduit 54 and valve 56 to ejection chamber 52 where the solder 44 is maintained liquid by heating element 58. Ejection chamber 52 is pressurized with a relatively inert gas, e.g. nitrogen or helium, at a pressure of from about ten (10) to about eighty (80) psi. The pressurized gas forces liquid solder 44 through filter 68 into ejection device 70 and out orifice 71 to form a fluid stream 79. Upon excitation of ejection device 70, drops 80 of liquid solder 44 are formed. Solder balls 86 are caught in container or catcher 84 after cooling and solidifying in the inert atmosphere.

Programmable controller 76 can be programmed to cause ejection device 70 to provide a first number of solder balls 86 of a specific predetermined diameter and then provide a second number of solder balls 86 of another specific predetermined diameter. If desired, controller 76 can be programmed to cause ejection device 70 to form a third or more numbers of solder balls 86 of other specific predetermined diameters. It will be appreciated that many different predetermined diameters of solder balls 86 may be produced if desired.

It will be appreciated that rather than maintaining the excitation or output signal to ejection device 70 from the drive electronics 78 at a single predetermined frequency, programmable controller 76 can be programmed to cause the frequency of the output signal from the drive electronics 78 to sweep or vary in a predetermined manner across a range of frequencies. For example, the frequency could be caused to sweep, in a linear manner, between about 5,000 hertz to about 1,000,000 hertz or between any two frequencies between 5,000 hertz and 1,000,000 hertz. The resulting production of solder balls 86 will include balls with diameters which vary from about 40 μm to about 50 μm when the frequency was swept between about 20,000 hertz and about 30,000 hertz. The number of solder balls 86 with diameters about a certain value would depend, of course, upon the manner and speed of the sweep of the excitation signal to ejection device 70.

Solder paste is made in accordance with the invention by selecting the amount, preferrably by weight, of solder balls 86 having a diameter which has been determined to be optimum for a particular application of paste. It will be appreciated that the amount of solder balls 86 may comprise a combination of solder balls 86 of different diameters and of different alloys. The solder balls 86 are then mixed with the amount of vehicle or fluid carrier determined to be optimum for the particular application. The fluid carrier, depending upon the application, could include a combination of rosin or derivatives thereof, an organic solvent, a thixotropic agent, an active hydrogen-containing compound, diluents, polymers, flux, etc. Conventional solder pastes comprise about 85% to 95% by weight of metal particles (solder alloy) and about 5% to 15% by weight of vehicle or carrier.

Figure 1:
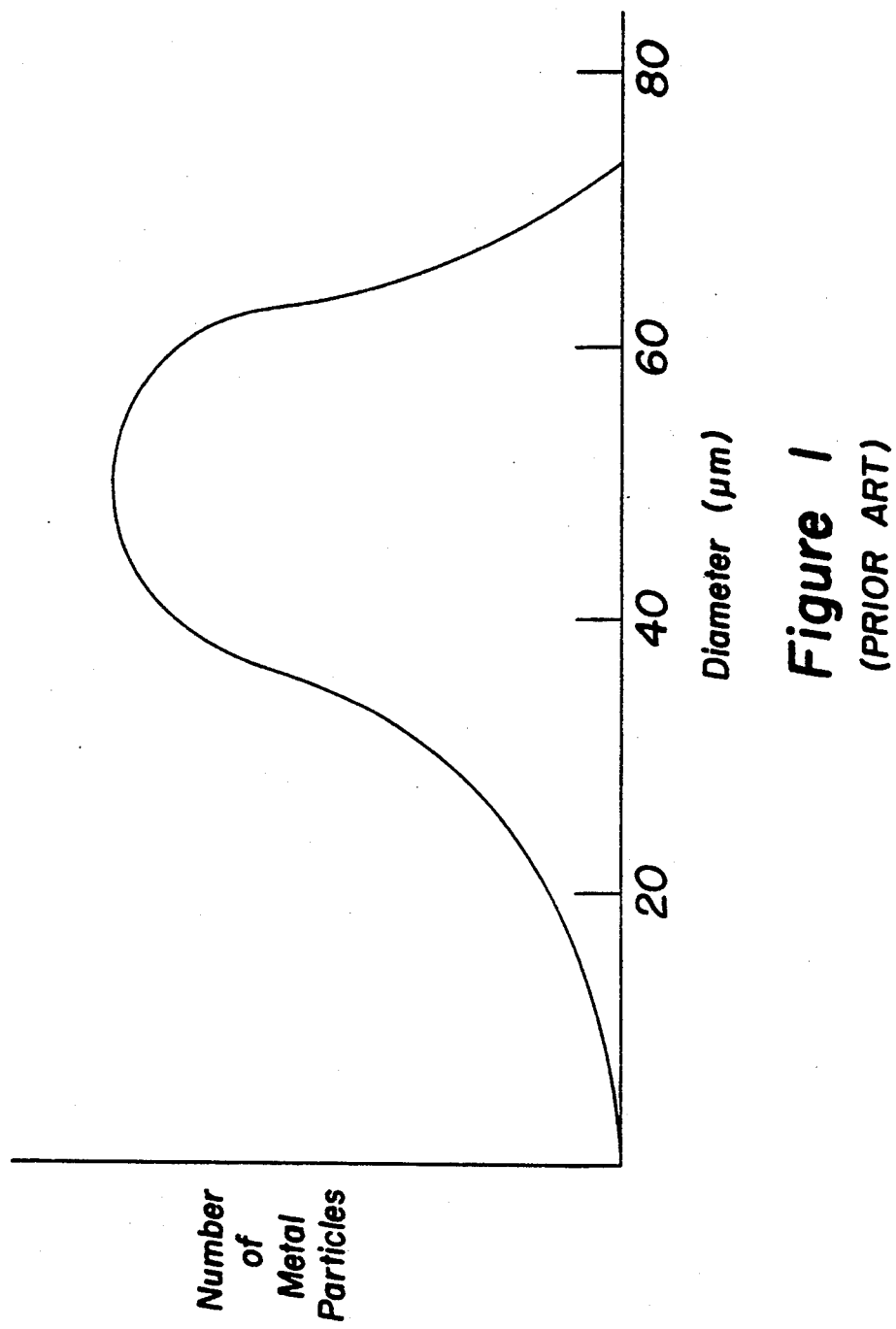
FIG. 1 is a graphic illustration of distribution by diameter of solder particles in conventional solder pastes.
Figure 2:
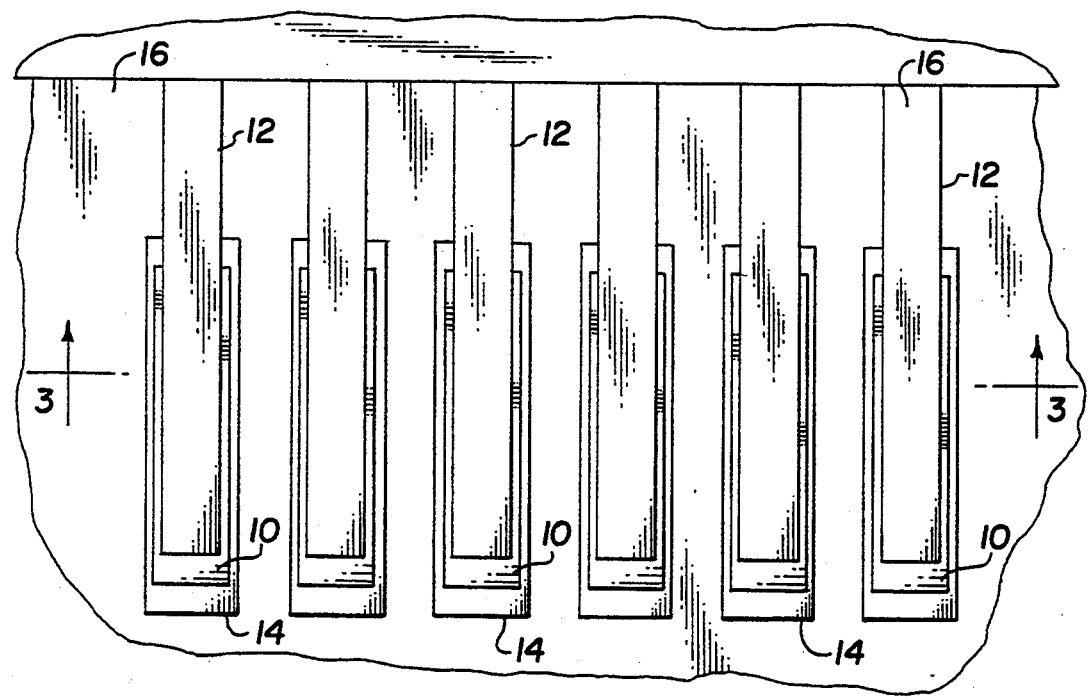
FIG. 2 is a simplified illustration of the relationship among the leads of a surface mount device, solder paste and pads on a substrate.
Figure 3:
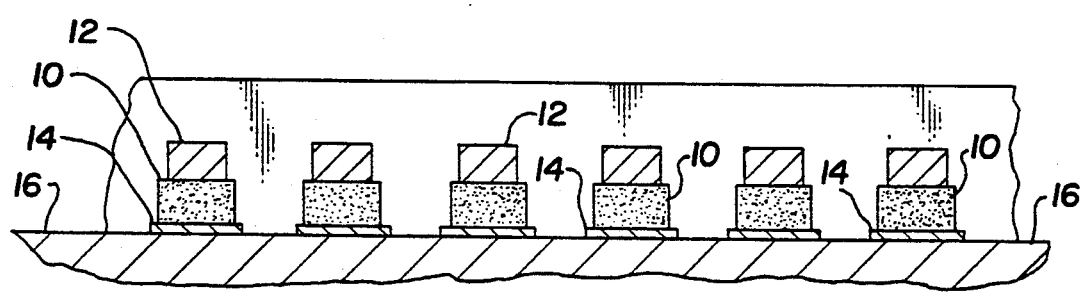
FIG. 3 is a cross-sectional view of the arrangement of FIG. 2 taken along line 3—3.

A typical application of solder paste is illustrated in FIGS. 2 and 3. Solder paste 10 is positioned between leads 12 of a surface mount device and pads 14 on a substrate 16. The solder paste 10 holds the leads 12 of the surface mount device in place until reflow occurs to bond the leads 12 to pads 14.

Figure 4:
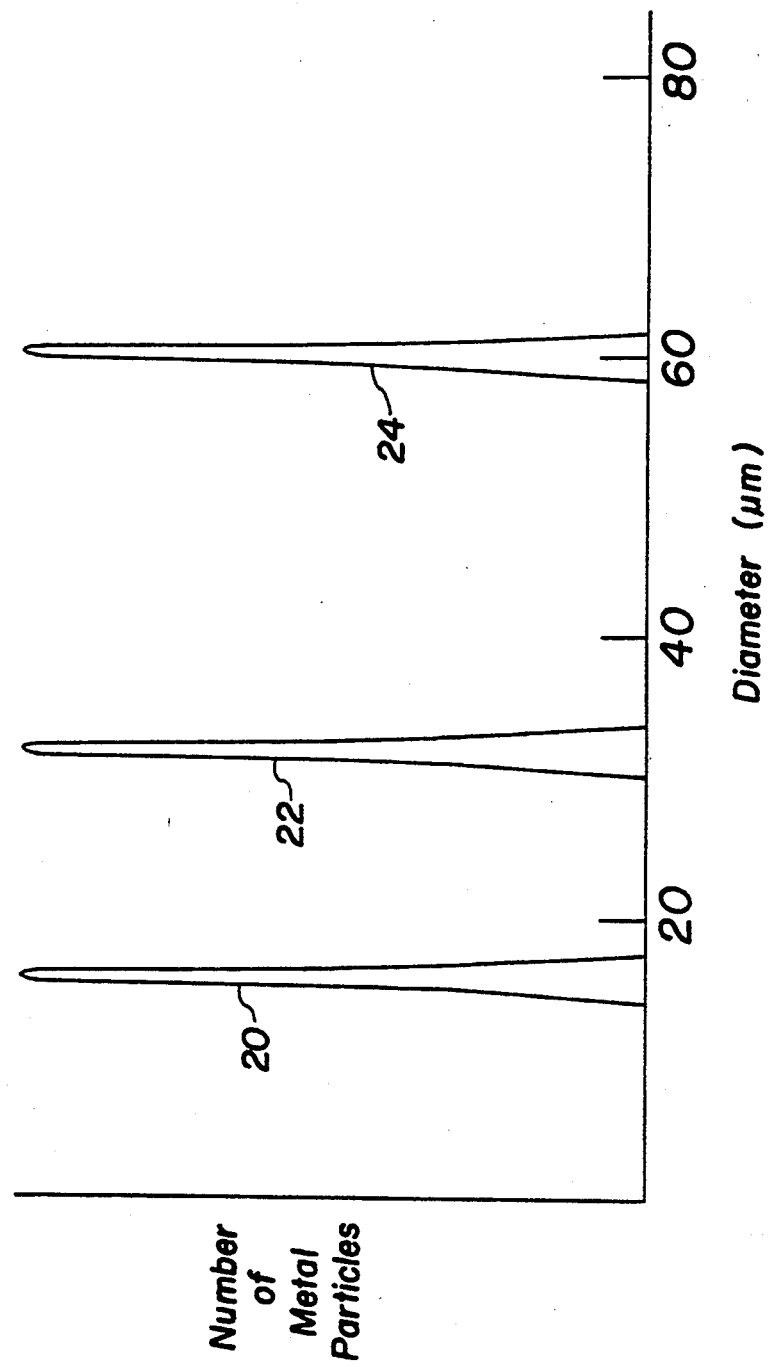
FIG. 4 is a graphic illustration of distribution by diameter of solder particles in solder paste formed in accordance with the invention.

The curves of FIG. 4 illustrate distribution of solder particles or balls of three different diameters for use in solder paste which may be readily provided with the present invention. Distribution curve 20 shows a quantity of solder particles or balls having a diameter less than 20 μm with a very narrow distribution of different diameters. Distribution curve 22 shows a quantity of solder particles or balls having a diameter of about 32 μm with a very narrow distribution of different diameters. Distribution curve 24 shows a quantity of solder particles or balls having a diameter about 60 μm with a very narrow distribution of different diameters. It will be appreciated that FIG. 4 shows only solder particles or balls of three different exemplary diameters and that the present invention can provide solder particles or balls for solder paste with diameters ranging from about 10 μm to about 80 μm with precise control.

Figure 5:
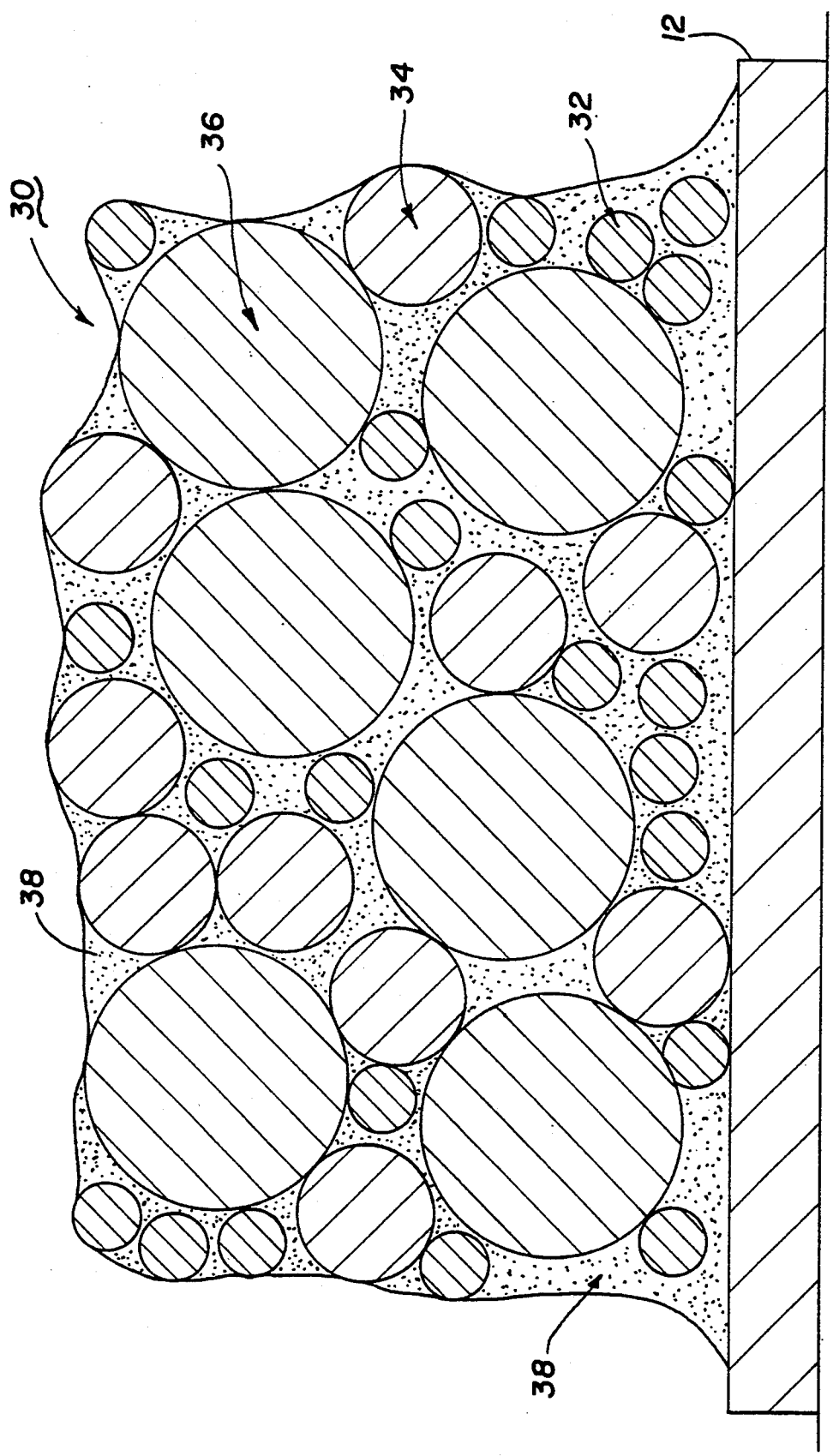
FIG. 5 is a simplified enlarged pictorial illustration of the cross-section of a solder paste body formed in accordance with the invention.
Figure 6:
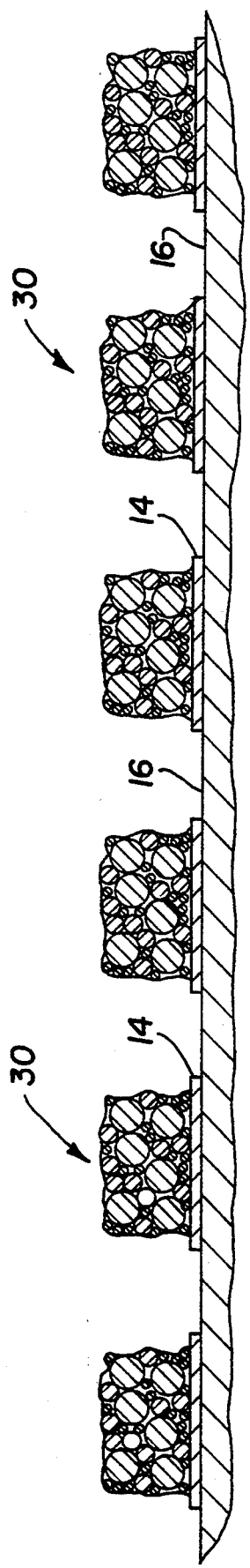
FIG. 6 is a sectional view illustrating a solder paste of the invention formed on pads of a substrate.

FIG. 5 shows solder paste 30 made with solder particles or balls 32, 34 and 36 of different diameters disposed in a carrier 38. As an example, solder balls 32 could have the diameter distribution shown in distribution curve 20; solder balls 34 could have the diameter distribution shown in distribution curve 22; and solder balls 36 could have the diameter distribution shown in distribution curve 24. A solder paste 30 prepared in accordance with the present invention and positioned on pads 14 on substrate 16 is illustrated in FIG. 6.

It will be appreciated that the present invention provides the capability to make solder pastes 30 with solder balls of only one diameter or with various combinations of solder balls of different diameters. Because the diameters of the solder balls are precisely controlled, the solder balls can be chosen to develop solder pastes which are tailored for a specific application. Furthermore, the different diameter solder balls may be made of the same metal alloy or of different metal alloys. The solder ball diameters can be chosen to increase or to decrease the total weight percent of solder in the solder paste; to improve the application thereof; and to allow a precise modification of the final alloy composition, etc.

Solder balls produced in accordance with the invention can be alloys of at least two metals selected from the group consisting of tin, bismuth, nickel, cobalt, cadmium, antimony, indium, lead, silver, gallium, aluminum, germanium, silicon and gold. Solder alloys may be eutectic alloys but eutectic compositions are not required.

The fluid carrier or vehicle 38 can be any of several compositions which may include, but not limited to, rosins or derivatives thereof, organic solvents, thixotropic agents, active hydrogen-containing compounds, diluents, polymers, flux, etc.

From the foregoing, it will be appreciated that the present invention provides improved solder pastes by 1) making metal particles or solder balls which are of precise and accurate diameter; 2) making metal particles or solder balls which are of precise and accurate but different diameters; 3) making metal particles or solder balls which are of precise and accurate diameter without substantial surface oxidation thereon.

Although the invention has been described with particular reference to presently preferred embodiments thereof, it will be appreciated that various modifications, alterations, variations, etc., may be made without departing from the spirit and scope of the invention as defined by the appended claims.

What is claimed:

1. A method of making solder paste comprising the steps of:
   (a) ejecting a stream of liquid solder from an ejection device toward a receptacle;
   (b) separating said stream of liquid solder into a plurality of substantially spherically-shaped liquid balls of a first predetermined uniform diameter;
   (c) providing an atmosphere of inert gas between said ejection device and said receptacle;
   (d) solidifying said liquid balls to form solid balls in said atmosphere of inert gas;
   (e) catching said solid balls in said receptacle; and
   (f) mixing the spherically-shaped solid balls with a fluid carrier to form a paste.

2. A method as set forth in claim 1 wherein said separating step comprises excitation of said ejection device with a signal of first predetermined frequency.

3. A method as set forth in claim 1 wherein said ejection device is a piezoelectric device.

4. A method as set forth in claim 1 wherein said ejection device is an electro-mechanical device.

5. A method as set forth in claim 1 further including the steps of:
   a) separating said stream of liquid solder into a plurality of substantially spherically-shaped liquid balls of a second predetermined uniform diameter; and
   b) catching said balls of a second predetermined diameter in a receptacle.

6. A method as set forth in claim 5 wherein separating said stream of liquid solder into a plurality of substantially spherically-shaped liquid balls of a second predetermined uniform diameter includes excitation of said ejection device with a signal of second predetermined frequency.

7. A method as set forth in claim 5 further including the steps of:
   a) separating said stream of liquid solder into a plurality of substantially spherically-shaped liquid balls of a third predetermined uniform diameter; and
   b) catching said balls of a third predetermined diameter in a receptacle.

8. A method as set forth in claim 7 wherein separating said stream liquid solder into a plurality of substantially spherically-shaped liquid balls of a third predetermined uniform diameter includes excitation of said ejection device with a signal of third predetermined frequency.

9. A method as set forth in claim 1 further including the steps of:
   a) maintaining liquid solder in an ejection chamber; and
   b) transferring liquid solder from said ejection chamber to said ejection device.

10. A method as set forth in claim 9 further including the step of maintaining the transferred solder in the liquid state in said ejection device.

11. A method as set forth in claim 1 wherein said ejection device comprises a continuous ejection device.

12. A method as set forth in claim 1 wherein said liquid solder is a mixture of at least two metals.

13. A method as set forth in claim 1 wherein said liquid solder is a mixture of at least two metals selected from the group consisting of tin, bismuth, nickel, cobalt, cadmium, antimony, indium, lead, silver, gallium, aluminum, germanium, silicon and gold.

14. A method as set forth in claim 1 wherein said carrier includes at least one component selected from the group consisting of rosin, solvent, a thixotropic agent, and active hydrogen-containing compound, diluents, polymers and flux.

15. A method as set forth in claim 1 wherein said solid balls comprise at least 80% by weight of the solder paste.

16. A method of making solder paste comprising the steps of:
   a) maintaining a supply of liquid solder in an ejection chamber;
   b) transferring liquid solder from said ejection chamber to an ejection device;
   c) positioning a receptacle remote from said ejection device;
   d) providing an atmosphere of inert gas between said ejection device and said receptacle;
   e) ejecting a stream of liquid solder from said ejection device by use of pressure;
   f) separating said stream of liquid solder into a plurality of substantially spherically-shaped drops of liquid solder;
   g) solidifying said drops of liquid solder to form solder balls in said atmosphere of inert gas;
   h) catching said solder balls in said receptacle; and
   i) mixing said solder balls with a fluid carrier to form a paste.

17. A method as set forth in claim 16 wherein said separating step comprises excitation of said ejection device with a signal which varies in a predetermined manner through a range of frequencies to form solder balls having a predetermined range of diameters.

18. A method as set forth in claim 17 wherein said range of frequencies comprises the frequencies between about 5,000 hertz and about 1,000,000 hertz.

19. A method as set forth in claim 17 wherein said predetermined range of diameters comprises diameters from about 10 $\mu$m to about 80 $\mu$m.

20. A method as set forth in claim 16 wherein said ejection device is a piezoelectric device.

21. A method as set forth in claim 16 wherein said ejection device is an electro-mechanical device.

22. A method as set forth in claim 16 further including the steps of:
   a) maintaining liquid solder in a reservoir; and
   b) transferring said liquid solder from said reservoir to said ejection chamber.

23. A method as set forth in claim 22 further including the step of maintaining the transferred solder in the liquid state in said ejection device.

24. A method as set forth in claim 16 wherein said ejection device comprises a continuous ejection device.

25. A method as set forth in claim 16 wherein said liquid solder is a mixture of at least two metals.

26. A method as set forth in claim 16 wherein said liquid solder is a mixture of at least two metals selected from the group consisting of tin, bismuth, nickel, cobalt, cadmium, antimony, indium, lead, silver, gallium, aluminum, germanium, silicon and gold.

27. A method as set forth in claim 16 wherein said carrier includes at least one component selected from the group consisting of rosin, solvent, a thixotropic agent, an active hydrogen-containing compound, diluents, polymers and flux.

28. A method as set forth in claim 16 wherein said solder balls comprise at least 80% by weight of the solder paste.

29. A method of producing solder balls of spherical shape comprising the steps of:
   a) maintaining a supply of liquid solder in an ejection chamber;
   b) transferring liquid solder from said ejection chamber to an ejection device;
   c) positioning a receptacle remote from said ejection device;
   d) providing an atmosphere of inert gas between said ejection device and said receptacle;
   e) ejecting a stream of liquid solder from said ejection device by use of pressure;
   f) separating said stream of liquid solder into a plurality of spherically-shaped drops of liquid solder of a first substantially uniform size;
   g) solidifying said drops of liquid solder to form solder balls in said atmosphere of inert gas; and
   h) catching said solder balls in said receptacle.

30. A method as set forth in claim 29 wherein said ejection device is a piezoelectric device.

31. A method as set forth in claim 29 wherein said ejection device is an electro-mechanical device.

32. A method as set forth in claim 29 further including the steps of:
   a) separating said stream of liquid solder into a plurality of spherically-shaped drops of liquid solder of a second substantially uniform size; and
   b) solidifying said drops of liquid solder of said second uniform size to form solder balls.

33. A method as set forth in claim 32 wherein said separating steps comprise excitation of said ejection device with signals of predetermined frequency.

34. A method as set forth in claim 29 further including the steps of:
   a) maintaining liquid in a liquid reservoir; and
   b) transferring liquid solder from said reservoir to said ejection chamber.

35. A method as set forth in claim 29 further including the step of maintaining the transferred solder in the liquid state in said ejection device.

36. A method as set forth in claim 29 wherein said ejection device comprises a continuous ejection device.

37. A method as set forth in claim 29 wherein said liquid solder is a mixture of at least two metals.

38. A method as set forth in claim 29 wherein said liquid solder is a mixture of at least two metals selected from the group consisting of tin, bismuth, nickel, cobalt, cadmium, antimony, indium, lead, silver, gallium, aluminum, germanium, silicon and gold.

39. A solder paste made by mixing the solder balls of claim 29 with a carrier in which said solder balls comprise at least 80% by weight of the solder paste.

40. A solder paste as defined in claim 39 wherein said carrier is a mixture of at least one component selected from the group consisting of rosin, solvent, a thixotropic agent, an active hydrogen-containing compound, diluents, polymers and flux.

41. A solder paste made by mixing the solder balls of claim 32 with a carrier in which said solder balls comprise at least 80% by weight of the solder paste.

42. A solder paste as defined in claim 41 wherein said carrier includes at least one component selected from the group consisting of rosin, solvent, a thixotropic agent, an active hydrogen-containing compound, diluents, polymers and flux.

43. A solder paste as defined in claim 41 wherein the diameters of the solder balls are within the range of about 10 μm to about 80 μm.

* * * * *

UNITED STATES PATENT AND TRADEMARK OFFICE
CERTIFICATE OF CORRECTION

PATENT NO. : 5,411,602
DATED : May 2, 1995
INVENTOR(S) : Donald J. Hayes It is certified that error appears in the above-identified patent and that said Letters Patent is hereby corrected as shown below:

Col. 6, line 56, change "stream liquid" to read ---stream of liquid---

Signed and Sealed this

Twelfth Day of September, 1995

Attest:

BRUCE LEHMAN

Attesting Officer     Commissioner of Patents and Trademarks

(12) REEXAMINATION CERTIFICATE (4744th)
United States Patent
Hayes

(10) Number: US 5,411,602 C1
(45) Certificate Issued: Mar. 4, 2003

(54) SOLDER COMPOSITIONS AND METHODS OF MAKING SAME

(75) Inventor: Donald J. Hayes, Plano, TX (US)

(73) Assignee: MicroFab Technologies, Inc., Plano, TX (US)

Reexamination Request:
No. 90/006,076, Aug. 2, 2001

Reexamination Certificate for:
Patent No.: 5,411,602
Issued: May 2, 1995
Appl. No.: 08/197,750
Filed: Feb. 17, 1994

Certificate of Correction issued Sep. 12, 1995. 08/197,750

(51) Int. Cl.$^7$ .............................. B23K 35/34; B22F 9/06
(52) U.S. Cl. .............................. 148/23; 148/24; 75/331; 75/335; 75/340
(58) Field of Search .................... 148/23, 24; 75/331, 75/335, 340, 351; 264/9

(56) References Cited

U.S. PATENT DOCUMENTS

| | | | | |
|---|---|---|---|---|
| 4,298,407 A | * | 11/1981 | Taylor | 148/24 |
| 4,342,606 A | * | 8/1982 | Notton | 148/23 |
| 4,373,974 A | * | 2/1983 | Barajas | 148/24 |
| 4,428,894 A | | 1/1984 | Bienvenu | |
| 5,229,016 A | | 7/1993 | Hayes et al. | |

OTHER PUBLICATIONS

Proceedings of the 1989 International Symposium on Microelectronics, Oct. 24–26, 1989 Baltimore Convention Center Sponsored by the International Society for Hybrid Microelectronics, pp. 627–634. Title: Application of Ink Jet Technology to Microelectronic Packaging, Authors: Donald J. Hayes and David B. Wallace of MicroFab Technologies, Inc. Transactions of the ASME—quarterly publication by the American Society of Mechanical Engineers, Jun. 1989 issue, vol. 111, pp. 108–111, Title: Automated Electronic Circuit Manufacturing Using Ink–Jet Technology, Author: D.B. Wallace of MicroFab Technologies, Inc.

\* cited by examiner

*Primary Examiner*—George Wyszomierski

(57) ABSTRACT

Spherical solder drops having precise and accurate shape are formed by an ejecction device and solidified to form solder balls for making solder pastes. The diameters of the solidified solder balls are determined by an excitation signal applied to the ejection device and changes in the diameter of the orifice in the ejection device. A solder paste is produced by mixing solidified solder balls of a single diameter or a combination of several different diameters with a carrier.

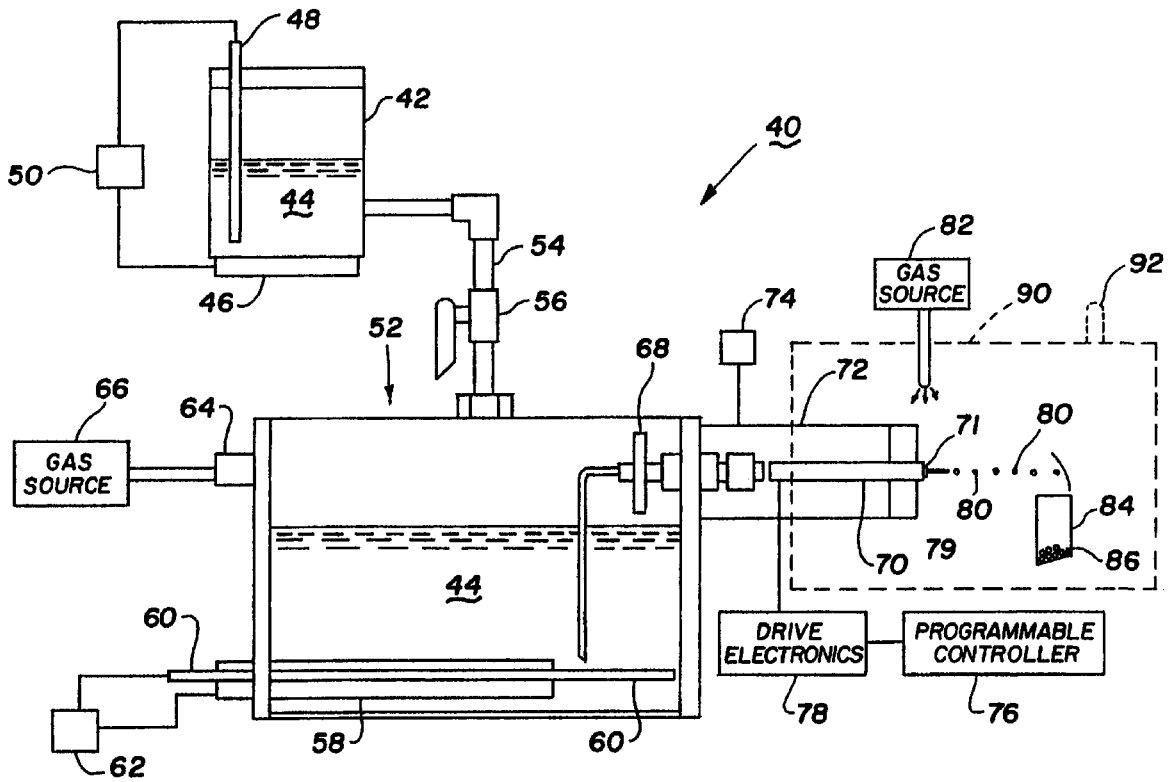

US 5,411,602 C1

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–43 are cancelled.

New claims 44–53 are added and determined to be patentable.

*44. A method of making solder paste comprising:*
*a) maintaining a supply of liquid solder in an ejection chamber;*
*b) transferring liquid solder from said ejection chamber to an ejection device;*
*c) positioning a receptacle remote from said ejection device;*
*d) providing an atmosphere of inert gas between said ejection device and said receptacle;*
*e) ejecting a stream of liquid solder from said ejection device by use of pressure;*
*f) separating said stream of liquid solder into a plurality of substantially spherically-shaped drops of liquid solder by exciting said ejection device with a signal which varies in a predetermined manner through a range of frequencies to form solder balls having a predetermined range of diameters from about 10 μm to about 80 μm;*
*g) solidifying said drops of liquid solder to form solder balls in said atmosphere of inert gas;*
*h) catching said solder balls in said receptacle; and*
*i) mixing said solder balls with a fluid carrier to form a paste.*

*45. A method as set forth in claim 44 wherein said range of frequencies comprises the frequencies between about 5,000 Hertz and about 1,000,000 Hertz.*

*46. A method as set form in claim 44 wherein said ejection device is a piezoelectric device.*

*47. A method as set forth in claim 44 wherein said ejection device is an electromechanical device.*

*48. A method as set forth in claim 44 further including:*
*maintaning liquid solder in a reservoir; and*
*transferring said liquid solder from said reservoir to said ejection chamber.*

*49. A method as set forth in claim 44 further including maintaining the transferred solder in the liquid state in said ejection device.*

*50. A method as set forth in claim 44 wherein said ejection device comprises a continuous ejection device.*

*51. A method as set forth in claim 44 wherein said liquid solder is a mixture of at least two metals selected from the group consisting of tin, bismuth, nickel, cobalt, cadmium, antimony, indium, lead, silver, gallium, aluminum, germanium, silicon and gold.*

*52. A method as set forth in claim 44 wherein said carrier includes at least one component selected from the group consisting of rosin, solvent, a thixotropic agent, an active hydrogen-containing compound, diluents, polymers and flux.*

*53. A method as set forth in claim 44 wherein said solder balls comprise at least 80% by weight of the solder paste.*

* * * * *